United States Patent
Perlov et al.

(10) Patent No.: US 6,575,737 B1
(45) Date of Patent: Jun. 10, 2003

(54) METHOD AND APPARATUS FOR IMPROVED SUBSTRATE HANDLING

(75) Inventors: Ilya Perlov, Santa Clara, CA (US); Alexey Goder, Sunnyvale, CA (US); Evgueni Gantvarg, Santa Clara, CA (US); Howard E Grunes, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 470 days.

(21) Appl. No.: 09/611,549

(22) Filed: Jul. 7, 2000

Related U.S. Application Data (63) Continuation-in-part of application No. 09/538,013, filed on Mar. 29, 2000, now Pat. No. 6,468,353, which is a continuation-in-part of application No. 09/332,207, filed on Jun. 12, 1999, now Pat. No. 6,287,386, which is a continuation of application No. 08/869,111, filed on Jun. 4, 1997, now Pat. No. 5,951,770.

(51) Int. Cl.$^7$ ............................................. C23C 16/00
(52) U.S. Cl. .................... 432/81; 204/298.25; 118/719; 118/724; 414/217; 414/222.01; 414/222.07
(58) Field of Search .............................. 432/6, 81, 124, 432/141, 253; 414/217, 331.04, 222.01, 937, 940, 222.07, 222.12, 223.01, 331.02; 62/62; 204/298.25; 118/719, 724, 725

(56) References Cited

U.S. PATENT DOCUMENTS

| | | | |
|---|---|---|---|
| 4,664,578 A | 5/1987 | Kakehi | |
| 4,776,744 A | 10/1988 | Stonestreet et al. | |
| 4,944,650 A | 7/1990 | Matsumoto | |
| 4,951,601 A | 8/1990 | Maydan et al. | |
| 4,971,512 A | 11/1990 | Lee et al. | |
| 5,091,217 A | 2/1992 | Hey et al. | |
| 5,133,635 A | 7/1992 | Malin et al. | |
| 5,302,209 A | 4/1994 | Maeda et al. | |
| 5,609,689 A | * 3/1997 | Kato et al. | 118/719 |
| 5,791,895 A | * 8/1998 | Kyung et al. | 432/253 |
| 5,818,137 A | 10/1998 | Nichols et al. | |
| 5,863,348 A | 1/1999 | Smith, Jr. et al. | |
| 5,951,770 A | * 9/1999 | Perlov et al. | 118/719 |
| 6,000,227 A | * 12/1999 | Kroeker | 62/62 |
| 6,007,675 A | 12/1999 | Toshima | |

* cited by examiner

Primary Examiner—Gregory Wilson
(74) Attorney, Agent, or Firm—Dugan & Dugan (57) ABSTRACT

A transfer chamber is provided. The transfer chamber has a temperature adjustment plate located in an upper portion of the chamber, a substrate handler located in a lower portion of the chamber, and a rotatable substrate carriage adapted so as to raise and lower between an elevation above a substrate supporting surface of the temperature adjustment plate, and an elevation below a substrate supporting blade of the substrate handler. The rotatable substrate carriage is adapted to transfer a substrate to and from the substrate supporting surfaces of the temperature adjustment plate, and of the substrate handler blade.

9 Claims, 12 Drawing Sheets

METHOD AND APPARATUS FOR IMPROVED SUBSTRATE HANDLING

This application is a continuation-in-part of U.S. patent application Ser. No. 09/538,013 filed Mar. 29, 2000, now U.S. Pat. No. 6,468,353 which is a continuation in part of U.S. patent application Ser. No. 09/332,207, filed Jun. 12, 1999, now U.S. Pat. No. 6,287,386, which is a continuation of U.S. patent application Ser. No. 08/869,111, filed Jun. 4, 1997 (now U.S. Pat. No. 5,951,770). Both U.S. patent application Ser. Nos. 09/322,207 and 09/538,013 are incorporated herein in their entirety by this reference.

FIELD OF THE INVENTION

The present invention relates to substrate processing, and more particularly to a method and apparatus for improved substrate handling.

BACKGROUND OF THE INVENTION

Cluster tools are commonly used in the fabrication of integrated circuits. A cluster tool typically includes a load lock chamber for introducing substrates (e.g., semiconductor wafers) into the tool and a central transfer chamber for moving substrates between the load lock chamber and a plurality of processing chambers and one or more cool down chambers mounted on the transfer chamber. Typically, either a single blade or a double blade robot is located within the transfer chamber to move substrates between the load lock chamber, the processing chambers, the cool down chamber (s) and then back to the load lock chamber. Exemplary cluster tools, robots and substrate handling methods are described in U.S. Pat. Nos. 4,951,601 and 5,292,393, both of which are incorporated herein by reference in their entirety.

Within a cluster tool a typical substrate handler arm capable of 360° rotation and extension is positioned inside the central transfer chamber. In operation the substrate handler rotates to align its blade with a sealable slit (e.g., a slit valve) which connects the central transfer chamber to a load lock chamber (i.e., a load lock slit). The substrate handler extends through the load lock slit, picks up a substrate, retracts, swings the blade about a central axis to position the substrate in front of a processing chamber slit (which connects the central transfer chamber with the processing chamber) and extends through the slit to place the substrate in the processing chamber. After the processing chamber finishes processing the substrate, the wafer handler extends through the processing chamber slit, picks of the substrate, retracts and moves to position the substrate in front of a cool down chamber slit. The substrate handler again extends placing the substrate in the cool down chamber and then retracts therefrom. After substrate cooling is complete, the substrate handler extends through the cool down chamber slit, picks up the substrate and retracts through the cool down chamber slit in order to extract the substrate and carry the substrate to another processing chamber or return the substrate to the load lock chamber. While the substrate is processing or cooling, the substrate handler places and extracts other substrates from the remaining chambers (e.g., load lock, processing or cool down chambers) in the same manner. Thus, the substrate handler undergoes a complex pattern of rotations or arcs about the axis and extensions, requiring a mechanically complex and expensive substrate handler. Further, each substrate handler extension and arcuate motion requires considerable operating space and may introduce reliability problems.

One way to improve system efficiency is to provide a robot arm having the ability to handle two substrates at the same time. Thus, some equipment manufacturers have provided a robot arm in which two carrier blades are swung about a pivot point at the robot wrist (e.g., via a motor and belt drive positioned at the substrate handler's wrist, or magnetic coupling between the robot shaft and a motor). Thus, a first substrate (e.g., to be processed) may be stored on one blade while the other blade picks up a second substrate (e.g., previously processed). The carrier blades are then repositioned and the first stored substrate is placed as desired. Such a mechanism is rather complex and requires a massive arm assembly to support the weight of a carrier blade drive located at the end of an extendible robot arm. For example, two drives are usually required for a system incorporating such a robot arm, whereby movement in opposite directions of the shafts extends or retracts the blade, and movement in the same direction swings the blade around the shafts' centerline. Any improvement in throughput provided by such a multiple carrier robot comes at a price of increased equipment/manufacturing cost, increased weight and power consumption, and increased complexity and, thus, reduced reliability and serviceability.

Another approach places two separate robot arms coaxially about a common pivot point. Each such robot arm operates independently of the other and improved throughput can be obtained through the increased handling capacity of the system. However, it is not simple to provide two robot arms for independent operation about a common axis. Thus, multiple drives must be provided, again increasing manufacture/equipment costs and complexity while reducing reliability.

The various processes which are performed on the various substrates, may require different processing times. Therefore, some substrates may remain in a chamber for a short period of time after processing is completed before they are moved into a subsequent processing chamber because the subsequent processing chamber is still processing another substrate. This causes a substrate back log and decreases system throughput.

In addition to varying processing times, another factor which affects throughput is the need to cool individual substrates following processing. Specifically, the number of movements a substrate handler must make in order to process numerous substrates increases significantly when the substrates must be transferred to one or more cool down chambers following each processing step. Additionally, incorporation of one or more cool down chambers reduces the number of positions on the transfer chamber where a processing chamber may be positioned. Fewer processing chambers can result in lower system throughput and can increase the cost of each wafer processed.

Therefore, there remains a need for a method and apparatus for improved substrate handling module which can increase substrate throughput while preferably providing substrate cooling.

SUMMARY OF THE INVENTION

A transfer chamber for use in substrate process is provided. The transfer chamber contains a rotatable substrate carriage, and a temperature adjustment plate located in the upper portion of the chamber and a substrate handler located in a lower portion of the chamber. The substrate carriage is adapted so as to raise and lower between an elevation below an elevation of the substrate handler's blade, and an elevation above the elevation of the substrate supporting surface of the temperature adjustment plate so as to place and extract substrates to and from the substrate handler's blade and the temperature adjustment plate.

Other features and aspects of the present invention will become more fully apparent from the following detailed description of the preferred embodiments, the appended claims and the accompanying drawings.

DETAILED DESCRIPTION OF THE PREFERRED EMBODIMENTS

Figure 1:
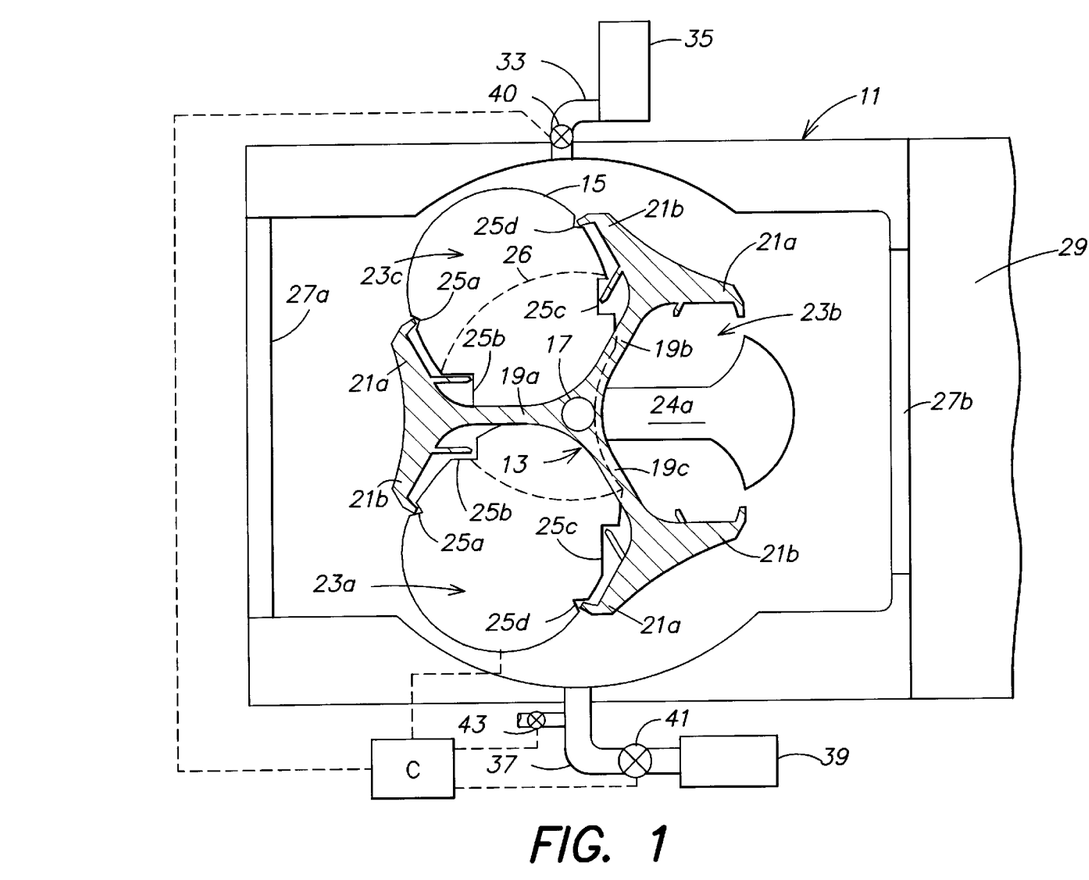
FIG. 1 is a top plan view of a chamber containing a preferred substrate carriage and temperature adjustment plate.

FIG. 1 is a top plan view of a chamber 11 containing a preferred substrate carriage 13 and temperature adjustment plate 15. A central shaft 17 is fixedly coupled to the temperature adjustment plate 15 and extends therefrom through a center region of the substrate carriage 13. Preferably the central shaft 17 is not in contact with the center region of the substrate carriage 13, but rather is coupled to the substrate carriage 13 via a motor (motor 57 in FIGS. 4A and 4B) as described further below with reference to FIGS. 4A and 4B. The substrate carriage 13 comprises three equally spaced branches 19a–c which extend radially outward from the center region of the substrate carriage 13. Each branch 19a–c comprises a pair of substrate supports 21a–b which face outwardly (i.e., away from each other) therefrom. The branches 19a–c are preferably machined from the same piece of material or may be made of two or more separate parts connected together using bolts, screws or other connectors including welding, such that they rotate and/or elevate together as a unit. The branches 19a–c and the substrate supports 21a (e.g., of a first branch 19a) and 21b (e.g., of a second branch 19b) are configured so as to define a plurality of substrate seats 23a–c each of which supports a substrate (not shown) by its edge. By placing a substrate (not shown) on a pair of substrate supports 21a–b secured to adjacent branches (e.g., branches 19a, 19b, branches 19a, 19c or branches 19b, 19c) a passage is maintained for a substrate handler blade 24a of a substrate handler 24 (shown in FIGS. 2A and 2B) to pass therethrough during substrate handoffs between the substrate carriage 13 and the substrate handler blade 24a, as described further below.

The substrate supports 21a–b are preferably made of a ceramic such as alumina, quartz or any other hard material which is compatible with semiconductor substrates and does not produce particles or scratch a substrate during contact therewith. The substrate supports 21a–b are attached to the underside of the branches 19a–c, such that the substrate carriage 13 may lower the substrate supports 21a–b below the top surface of the temperature adjustment plate 15, and below the substrate handler blade 24a, thus transferring a substrate supported by a substrate seat 23a–c to the temperature adjustment plate 15 and/or to the substrate handler blade 24a, while the remainder of the substrate carriage 13 (i.e., the branches 19a–c) remains above and does not contact either the temperature adjustment plate 15 and/or the substrate handler blade 24a. A preferred mechanism for lifting and lowering the substrate supports 21a–b (and the substrate carriage 13) is described below with reference to FIGS. 4A and 4B.

The temperature adjustment plate 15 is configured to simultaneously support two substrates (not shown), when the substrate carriage 13 lowers the substrate supports 21a–b to an elevation below the top surface of the temperature adjustment plate 15. In order to achieve uniform heating or cooling across the entire substrate surface, the temperature adjustment plate 15 is preferably coextensive with the substrates placed thereon. Thus, in order to allow the substrate supports 21a–b to lower to an elevation below that of the top surface of the temperature adjustment plate 15, the temperature adjustment plate 15 includes four notches 25a–d placed to receive the substrate supports 21a–b. Preferably the temperature adjustment plate 15 also comprises a cut out region 26 in which the substrate handler 24 (FIGS. 2A and 2B) may be housed. As best understood with reference to FIGS. 2A and 2B, the cut out region 26 is configured to provide sufficient space for the substrate handler 24 to swing about a central axis when the substrate handler 24 extends and retracts without interfering engagement with a heating plate 15a.

Preferably the chamber 11 has two sealable slits 27a–b (e.g., conventional slit valves) positioned on opposite walls of the chamber 11. Preferably the first slit 27a is disposed to receive substrates from a substrate handler (not shown) which travels among a plurality of transfer chambers (not shown) configured such as transfer chamber 11, and the second slit 27b is coupled to a processing chamber 29, as described in detail in co-pending U.S. Provisional Patent Application Serial No. 60/187,133, filed Mar. 6, 2000 (AMAT No. 4026), the entire disclosure of which is incorporated herein by this reference. The processing chamber 29 is coupled to the slit 27b opposite the substrate handler 24, such that the substrate handler blade 24a travels in a straight line (e.g., along a single axis) to place and extract substrates within and from the processing chamber 29, as further described with reference to FIGS. 2A and 2B.

Figure 2A:
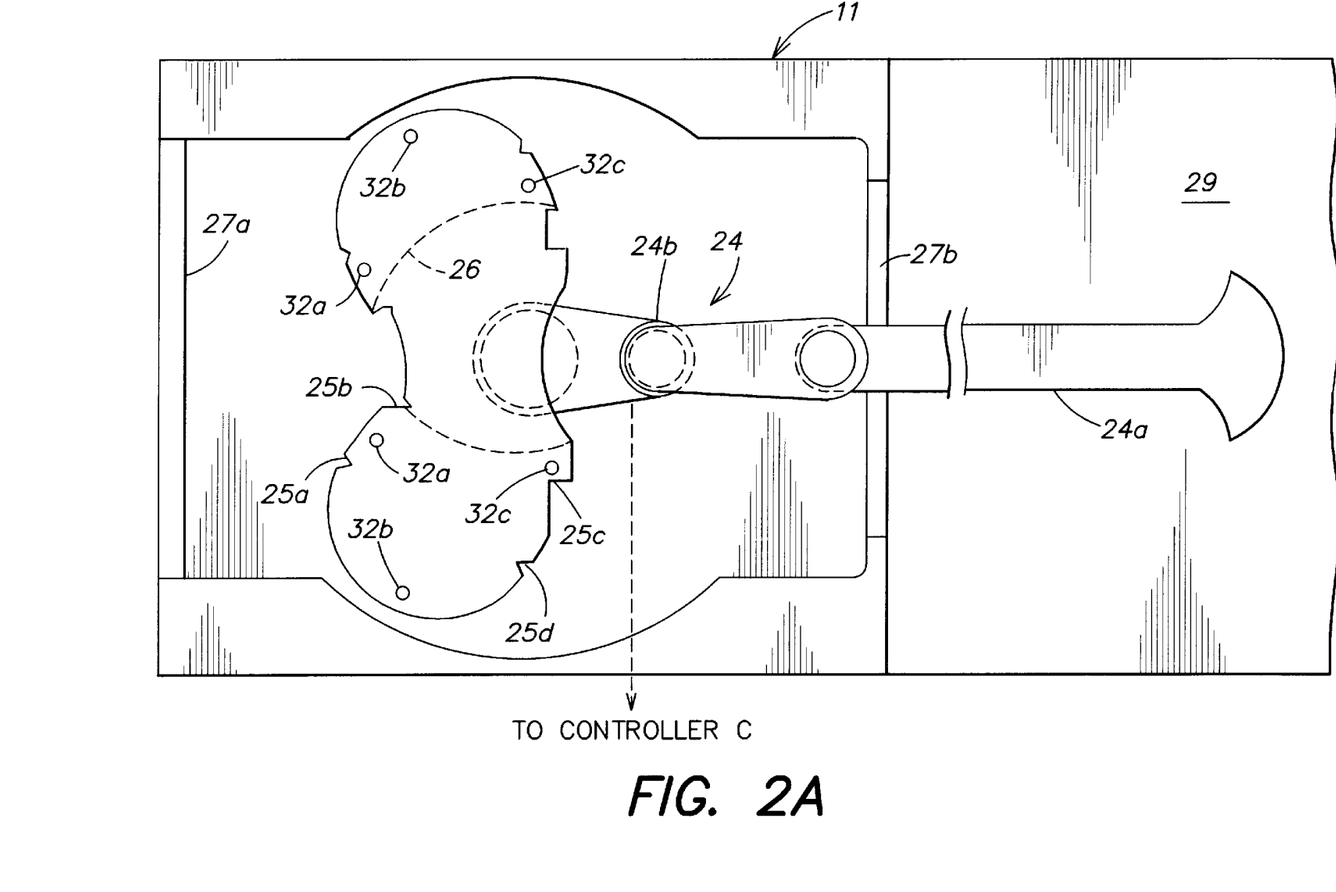
FIG. 2A is a top plan view of the chamber of FIG. 1 showing a substrate handler in an extended position.
Figure 2B:
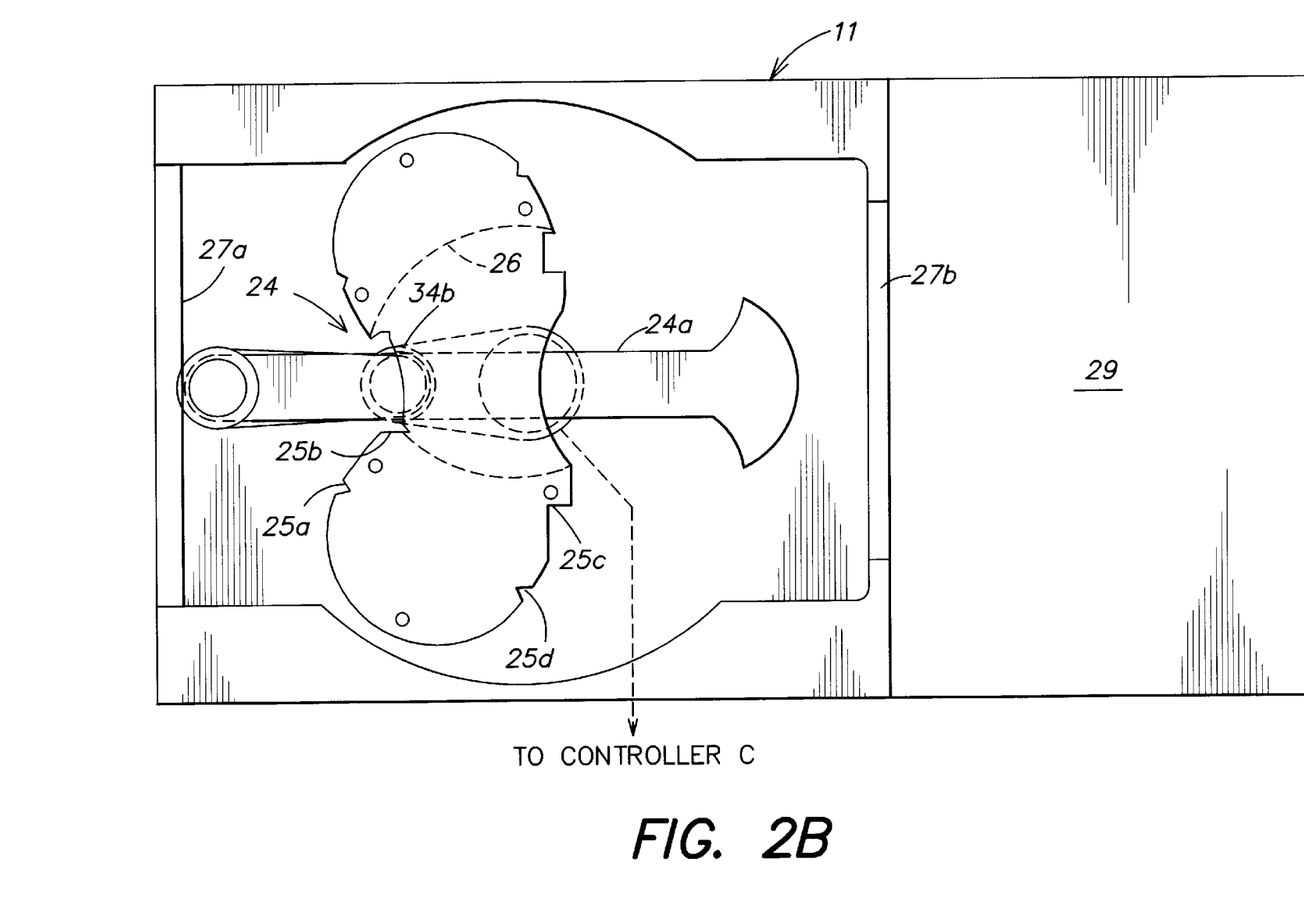
FIG. 2B is a top plan view of the chamber of FIG. 1 showing a substrate handler in a retracted position.

FIG. 2A is a top plan view of the chamber 11 of FIG. 1, showing the substrate handler 24 in an extended position, and FIG. 2B is a top plan view of the chamber 11 of FIG. 1 showing the substrate handler 24 in a retracted position. The exemplary substrate handler 24 of FIGS. 2A–B may be analogized to a human arm having an elbow 24b which extends outwardly when the arm retracts. Such extendable arm type substrate handlers are conventionally employed in semiconductor fabrication and their specific configuration is well known in the art. Accordingly the notch 26 located in the temperature adjustment plate 15 is sized and shaped to accommodate the substrate handler 24's elbow 24b during substrate handler retraction, as shown in FIG. 2B. The substrate handler 24 preferably includes a wafer gripping mechanism (not shown) as described in parent application Ser. No. 09/332,207 which stabilizes and centers a substrate supported by the blade 24a.

Figure 3A:
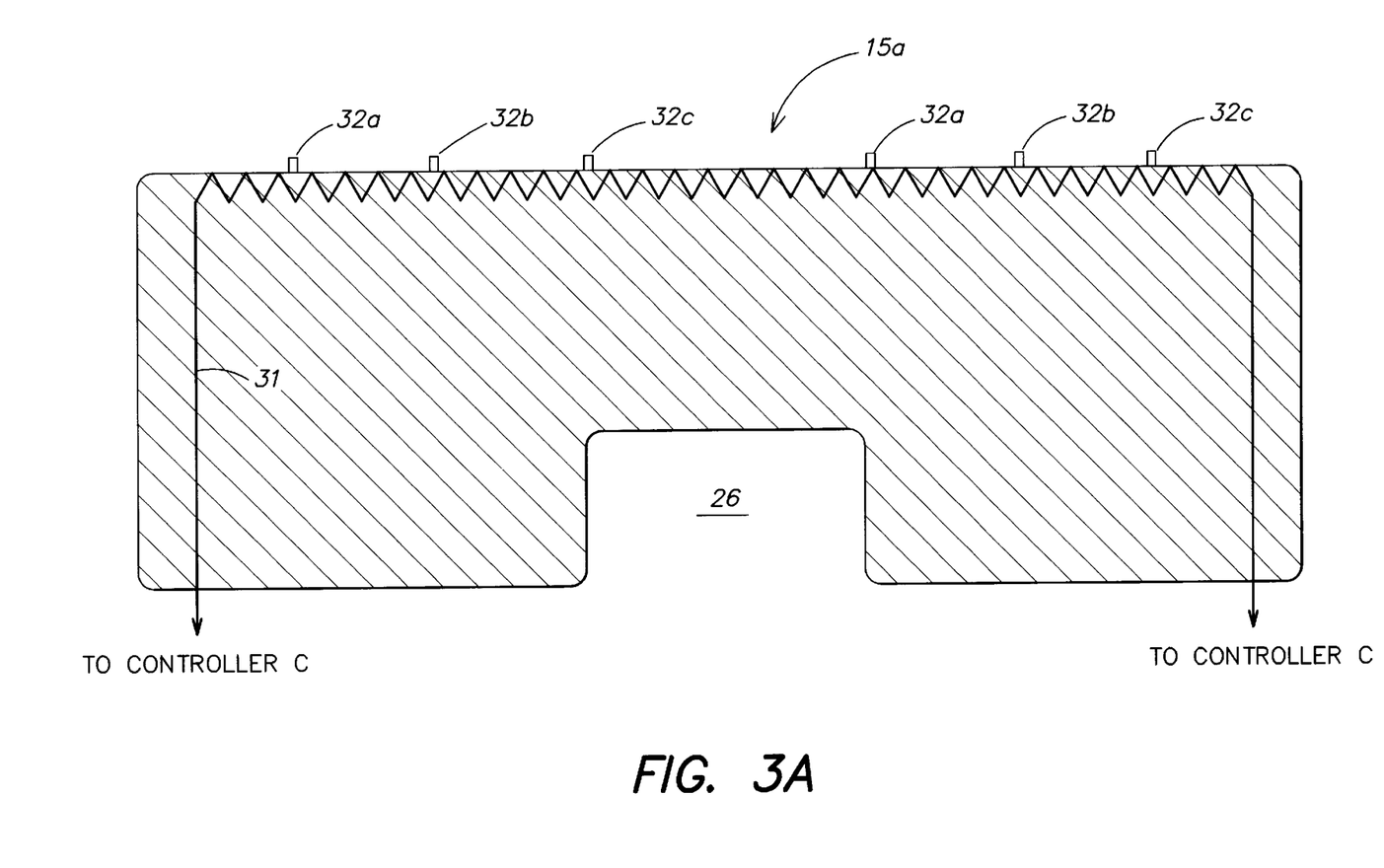
FIG. 3A is a side elevational view of a temperature adjustment plate configured for heating.

FIG. 3A is a side elevational view of a temperature adjustment plate 15a configured for heating (i.e., a heat plate 15a) that may be employed as the temperature adjustment plate 15. The heating plate 15a has a resistive heating element 31 disposed therein. The heating plate 15a may comprise any conventional heated substrate support (e.g., a stainless steel substrate support) having a temperature range sufficient for the heating process to be performed (typically about 150–600° C. for most annealing applications). A substrate (e.g., a semiconductor wafer) may be placed directly on the heating plate 15a (e.g., via the substrate carriage 13); or optionally, on a plurality of pins 32 (preferably 3–6 pins, most preferably three pins 32a–c per substrate as shown in FIGS. 2A and 2B) which extend from the heating plate 15a, so as to facilitate gas flow along the backside of the substrate and so as to reduce contact between the substrate and the heating plate 15a (thereby reducing particle generation by such contact). The heating plate 15a of FIG. 3A includes two sets of pins 32a–c for supporting two substrates. Short pin heights facilitate heat transfer from the heating plate 15a to a substrate (not shown) positioned thereon; preferably the pins 32a–c are between 0.005–0.02 inches in height.

To improve substrate temperature uniformity during heating, the heating plate 15a preferably is larger than the diameter of the substrate being heated (e.g., such that the heating plate extends about an inch beyond the diameter of each substrate positioned thereon). The heating plate 15a heats a substrate primarily by conduction (e.g., either direct contact conduction if a substrate touches the heating plate 15a or conduction through a dry gas such as nitrogen disposed in the chamber and thus between the heating plate 15a and a substrate when the substrate rests on the pins 32a–c). A convective heating component also may be employed if gas is flowed along the backside of the substrate during heating. However, the heating plate 15a may require an elevated edge (not shown) or an electrostatic chuck (as is known in the art) so as to prevent substrate movement due to such backside gas flow.

The chamber 11 preferably has a small volume to allow for rapid evacuation of the chamber (described below) and to reduce process gas consumption. As shown in FIG. 1, a gas inlet 33 couples an inert dry gas source 35 (such as a noble gas or nitrogen, preferably 100% $N_2$ having fewer than a few parts per million of $O_2$ therein, or 4% or less of $H_2$ diluted in $N_2$ and having fewer than a few parts per million of $O_2$ therein) to the chamber 11. The gas emitted from the dry gas source 35 may be further "dried" via a getter or cold trap (not shown) within the gas inlet 33. A gas outlet 37 couples the chamber 11 to a vacuum pump 39 which, in operation, pumps gas from the chamber 11. Thus the chamber 11 can be periodically or continuously purged with inert gas to remove particles and desorbed gasses from the chamber 11.

The rate at which the inert gas flows into the chamber 11 is controlled via a needle valve or flow controller 40 (e.g., a mass flow controller) operatively coupled along the gas inlet 33. Preferably, the vacuum pump 39 comprises a rough-pump, such as a dry pump, having a pumping speed of between about 1–50 liters/sec for rapid evacuation of the chamber 11. The gas outlet 37 comprises an isolation valve 41, such as a pneumatic roughing port valve, operatively coupled to the vacuum pump 39 so as to control the gas flow rate from the chamber 11 and preferably further comprises a chamber exhaust valve 43 for use during chamber purging. Because a rough pump is capable of evacuating a chamber to a pressure of a few milliTorr or higher, a rough pump alone may be employed for applications wherein the chamber 11 is not evacuated below a pressure of a few milliTorr (e.g., when the chamber 11 is vented to atmospheric pressure with a non-oxidizing gas such as nitrogen prior to loading a substrate therein or when a substrate is transferred from the chamber 11 to a processing chamber 29 that employs pressures of a few milliTorr or higher). However, for applications that require pressures below a few milliTorr (e.g., pressures which cannot be obtained with a rough pump alone), a high vacuum pump (not shown) such as a cryopump also may be employed to allow substrate transfer between a high vacuum processing chamber and the chamber 11 (e.g., in a chamber configured such as that described in parent application Ser. No. 09/332,207, which does not employ a temperature adjustment plate 15, or in a chamber wherein the temperature adjustment plate 15 is positioned so as to allow substrate transfer to and from additional processing chambers).

To pre-condition the chamber 11 to a predetermined contamination level (e.g., so that less than 10 parts per million of $O_2$ reside in the chamber 11) the chamber 11 may be purged at atmospheric pressure by flowing dry gas from the dry gas source 35 into the chamber 11 with the chamber exhaust valve 43 open, may be single-evacuation purged by evacuating the chamber 11 to a predetermined vacuum level via the pump 39 (by opening the isolation valve 41 coupled therebetween) and then back filling the chamber 11 with dry gas from the dry gas source 35, or may be cycle purged by repeatedly evacuating the chamber 11 to a predetermined vacuum level and then back filling the chamber 11 with dry gas from the dry gas source 35 to further reduce contamination levels beyond those achievable by atmospheric pressure or single evacuation purging.

Figure 3B:
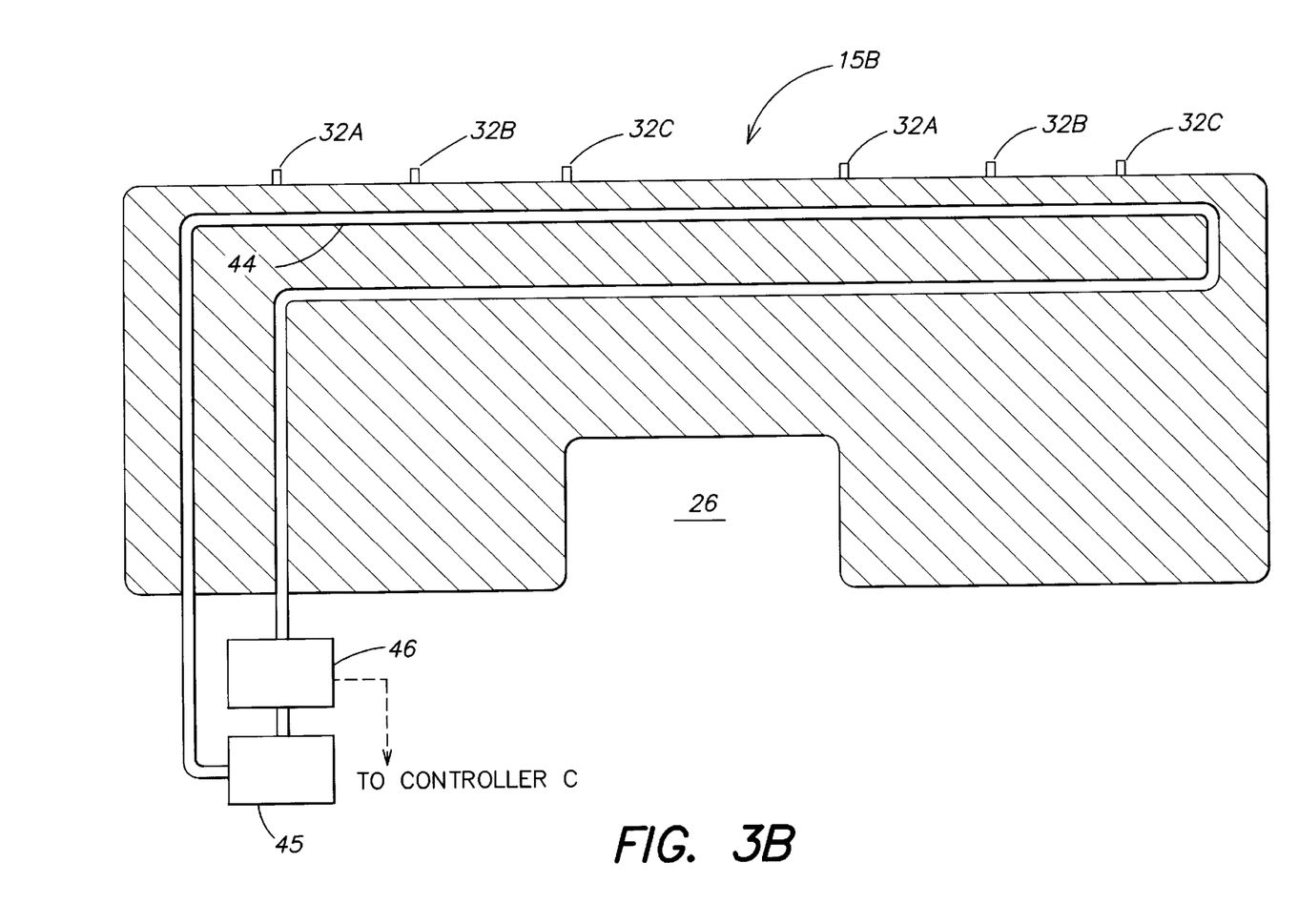
FIG. 3B is a side elevational view of a temperature adjustment plate configured for cooling.

FIG. 3B is a side elevational view of a temperature adjustment plate 15b configured for substrate cooling (i.e., a cooling plate 15b) that may be employed as the temperature adjustment plate 15 for the chamber 11. Specifically, to affect rapid cooling of a substrate following substrate heating within the processing chamber 29 the substrate is placed on the cooling plate 15b via the substrate carriage 13, and water or a refrigerant (e.g., a 50% de-ionized water, 50% glycol solution having a freezing point below that of pure water) is flowed through channels 44 in the cooling plate 15b disposed within the cooling plate 15b. For example, an aluminum cooling plate may be cooled to about 5 to 25° C. by a cooling fluid supplied thereto from a cooling fluid source 45 via a pump 47.

The cooling plate 15b preferably also employs a diffuser design as is known in the art, having up to ten thousand 0.02–0.1 inch diameter holes therein (not shown). The holes allow gas to flow through the cooling plate 15b (e.g., from the dry gas source 35) and to be cooled by the cooling plate 15b so as to improve cooling of a substrate positioned thereon (e.g., by cooling a backside of the substrate). Like the heating plate 15a the cooling plate 15b may require an elevated edge (not shown) or an electrostatic chuck (as is known in the art) so as to prevent substrate movement due to such backside gas flow. The walls of the chamber 11 may be the water or refrigerant cooled as well to further enhance substrate cooling.

Figure 3C:
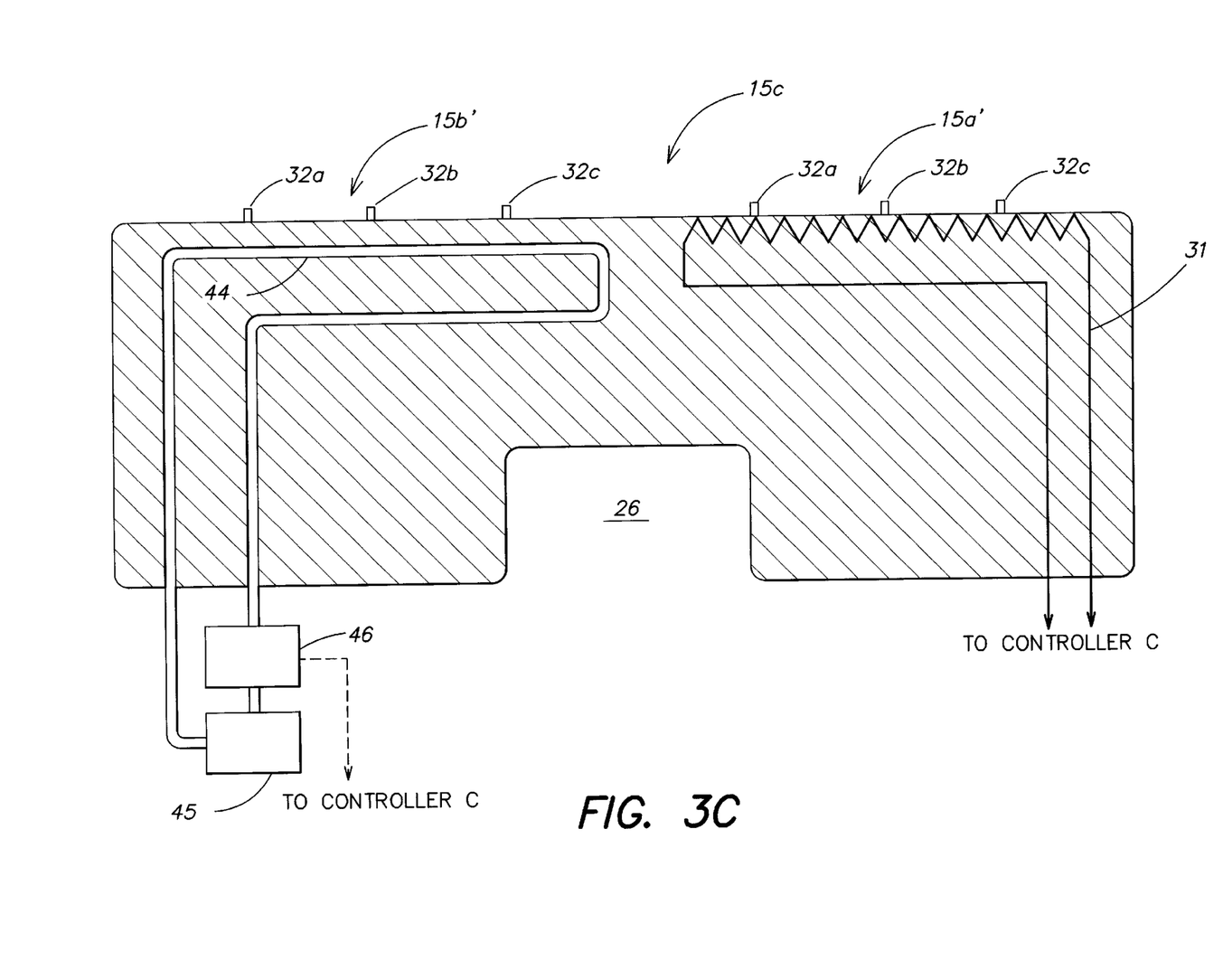
FIG. 3C is a side elevational view of a temperature adjustment plate configured for both heating and cooling.

FIG. 3C is a top plan view of a temperature adjustment plate 15c configured for both heating and cooling, where a first substrate location (identified by reference numeral 15a') is configured for substrate heating as described with reference to FIG. 3A; and a second substrate location (identified by reference numeral 15b') is configured for substrate cooling as described with reference to FIG. 3B. The two substrate locations 15a', 15b' may be part of an integral plate, or may comprise two physically separated plates preferably with a distance of at least one inch therebetween.

Regardless of the specific temperature adjustment plate 15a–c which the inventive chamber 11 employs, the inventive chamber 11 comprises relatively inexpensive components (e.g., the rotatable substrate carriage 13 and the substrate handler 24 (preferably adapted only for transferring a substrate along a straight line (i.e., a linear substrate handler) such as between the chamber 11 and a processing chamber)). Heating and/or cooling is economically performed with reduced footprint and increased throughput as the need for substrate transfer time to a separate heating and/or cooling module is eliminated. A controller C (FIG. 1) is coupled to the various chamber components (e.g., to the temperature adjustment plate 15, to the flow controller 40, to the isolation valve 41, to the chamber exhaust valve 43, to the cooling fluid source 45, to the heating element 31, to the substrate handler 24, to the motor 57, etc.) and is programmed so as to cause the inventive chamber 11 to perform the inventive method described below.

Figure 4A:
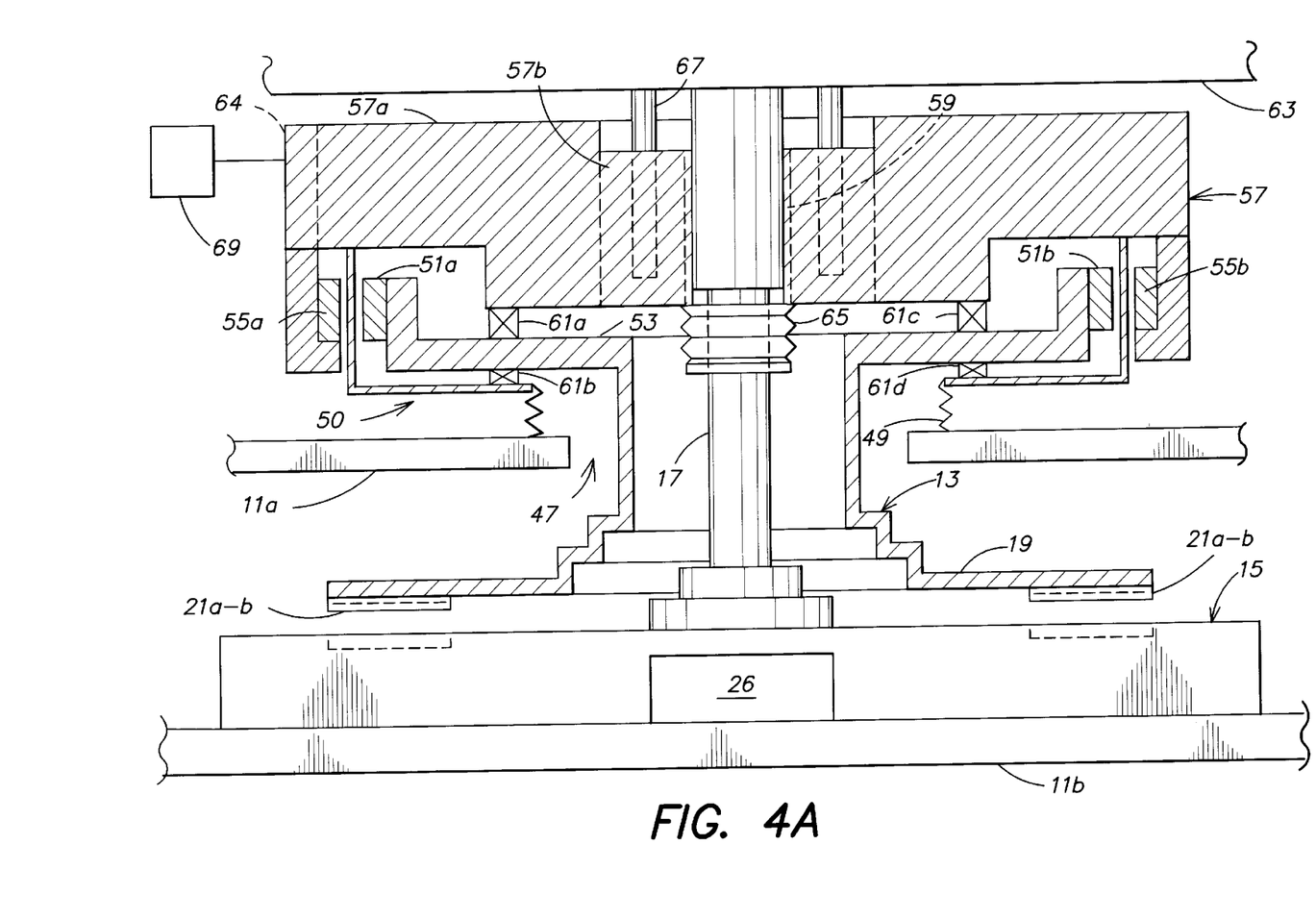
FIG. 4A is a front elevational view showing a magnetically coupled substrate carrier in an elevated position.
Figure 4B:
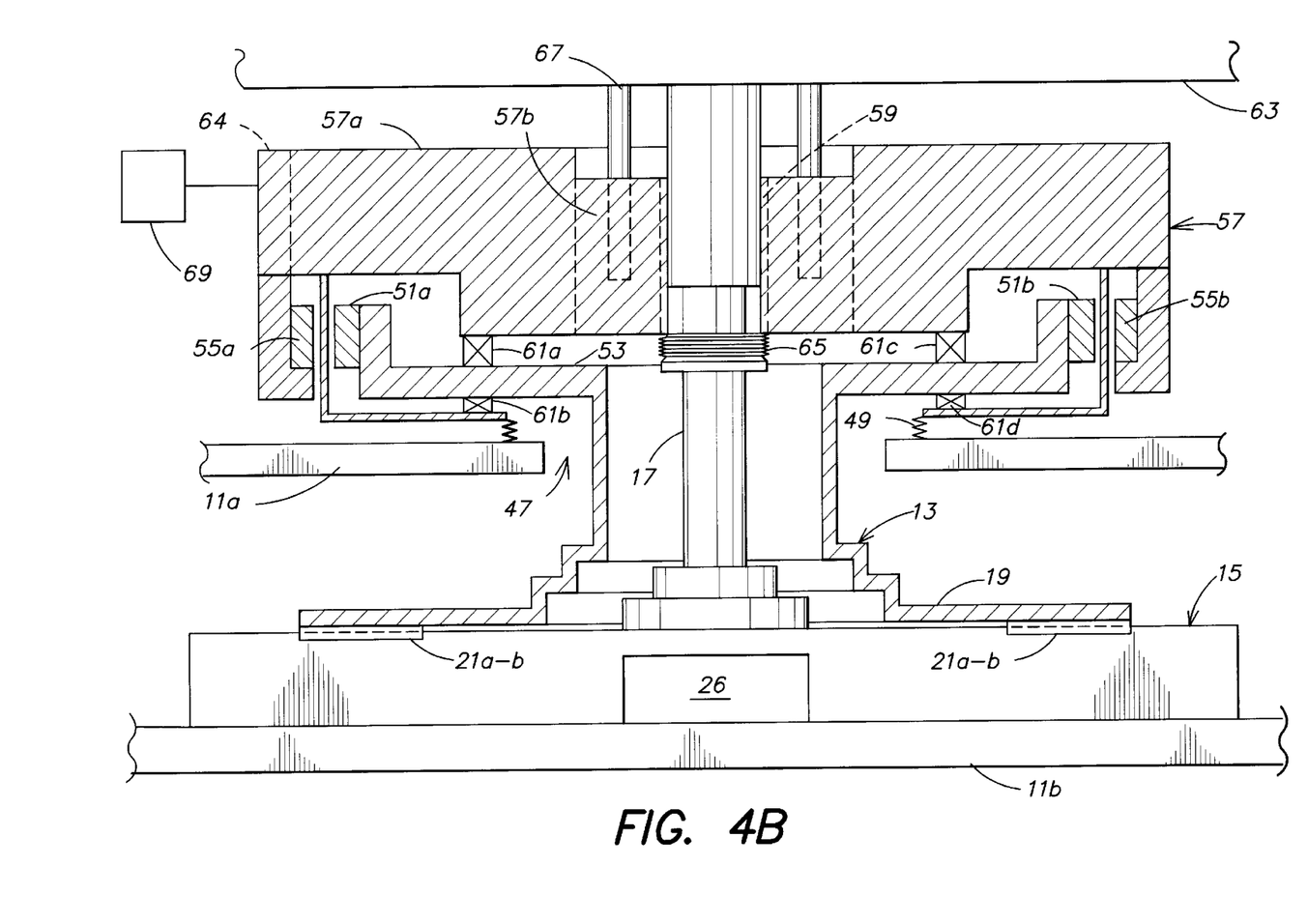
FIG. 4B is a front elevational view showing a magnetically coupled substrate carrier in a lowered position.

FIGS. 4A and 4B are front cross-sectional views of the preferred substrate carriage 13 in an elevated position and in a lowered position, respectively. As described below, the preferred substrate carriage 13 employs magnetic coupling.

With reference to FIGS. 4A and 4B, the central shaft 17 extends upwardly through an aperture 47 in a top surface 11a of the chamber 11. A first bellows 49 seals the aperture 47 to an enclosure wall 50, positioned above and supported in a fixed position with respect to the chamber 11. The enclosure wall 50 encloses an internal magnet support 53 which is fixedly coupled to, or integrally formed with the substrate carriage 13, such that the internal magnet support 53 and the substrate carriage 13 move together as a unit. Note that the central shaft 17 supports the motor/magnet structure above the chamber, and provides a fixed reference with central shaft 17 also supported off the interior of the transfer chamber 11 or a component thereof such as the temperature adjustment plate 15.

As shown in FIGS. 4A and 4B, a plurality of internal magnets 51a–n (only internal magnets 51a and 51b are shown) are coupled to the internal magnet support 53 and are spaced from and are magnetically coupled to a plurality of external magnets 55a–n (only external magnets 55a and 55b are shown). The external magnets are supported on a ring supported to the enclosure wall 50, such that they may be moved in a circle about or linearly with respect to the axis of the central shaft 17. The internal and external magnets 51a–n, 55a–n preferably are permanent magnets having a number and spacing sufficient to allow the internal magnets 51a–n (and the substrate carriage 13 coupled thereto) to rotate when the external magnets 55a–n are rotated, and to elevate (i.e., lift or lower) when the external magnets 55a–n are elevated. Preferably there are four internal magnets 51a–n and four external magnets 55a–n, each equally spaced, although other numbers of magnets and other magnet spacings may be employed depending on such factors as magnet strength, the material that separates the internal and external magnets (e.g., the material used for the enclosure wall 50), the torque exerted on the external magnets during rotation, etc.

A motor 57 (FIGS. 4A and 4B) is coupled to the external magnets 55a–n, to the central shaft 17 via a slideable connection 59 (e.g., a guide rail connection) so as to slide vertically along the central shaft 17, and to the internal magnet support 53 via a plurality of bearings 61a–n. The motor 57 preferably comprises both a rotational motor portion 57a for providing rotational motion to the external magnets 55a–n (and thus to the internal magnets 51a–n and to the substrate carriage 13) and a linear motor portion 57b for translating the external magnets 55a–d (and thus the internal magnets 51a–n and the substrate carriage 13) relative to the central shaft 17 (as described below). Both the motor 57 and the central shaft 17 are coupled to a supporting structure 63 (e.g. an equipment chassis, or any other support structure). A second bellows 65 seals the chamber 11 from particles/contaminants generated by the slideable connection 59 which exists between the motor 57 and the central shaft 17.

In operation, to rotate the substrate carriage 13, the rotational motor portion 57a of the motor 57 is energized (e.g., by applying AC or DC power thereto as is known in the art) so as to exert rotational force on the external magnets 55a–n (e.g., via a rotor 64 of the rotational motor portion 57a). Due to magnetic coupling between the internal and external magnets 51a–n, 55a–n, as the external magnets 55a–n rotate under the applied rotational force, the internal magnets 51a–n and the substrate carriage 13 coupled thereto also rotate. The bearings 61a–d allow the internal magnet support 53 to rotate freely relative to the stationary portions of the motor 57. The substrate carriage 13 (which is fixedly coupled to the internal magnet support 53) thereby is rotated, and may be rotated 360° if the rotational motor portion 57a is energized for a sufficient time period.

To raise and lower the substrate carriage 13, the linear motor portion 57b of the motor 57 is employed to translate the substrate carriage 13 relative to the central shaft 17. For example, to lower the substrate carriage 13 from its raised position (FIG. 4A) to its lowered position (FIG. 4B) wherein the pair of substrate supports 21a–b extend below a top surface of the temperature adjustment plate 15, the linear motor portion 57b of the motor 57 is energized so that a translating portion 67 (e.g., a motor shaft) of the linear motor portion 57b is extended. As the translating portion 67 extends, due to contact with the stationary structure 63, the remainder of the motor 57 is pushed away from the stationary structure 63 while the central shaft 17 remains stationary. In this manner, the motor 57 (with the exception of the translating portion 67) slides along the slideable connection 59 toward the temperature adjustment plate 15, translating the external magnets 55a–n, the internal magnets 51a–n and the substrate carriage 13 (each of which are coupled either directly or via bearings to the motor 57) toward the temperature adjustment plate 15. The substrate carriage 13 thereby is lowered.

To raise the substrate carriage 13 from its lowered position (FIG. 4B) to its raised position (FIG. 4A) wherein the pair of substrate supports 21a–b are above the top surface of the temperature adjustment plate 15, the translating portion 67 is retracted. In response thereto, the remainder of the motor 57, and the external magnets 55a–n, the internal magnets 51a–n and the substrate carriage 13 coupled thereto, translate away from the temperature adjustment plate 15. The substrate carriage 13 thereby is raised (FIG. 4A). Preferably, a controller 69 (or the controller C of FIG. 1) is coupled to the motor 57 and is programmed to control the operation/timing of the raising, lowering and rotating functions of the substrate carriage 13 described above.

Figure 5A:
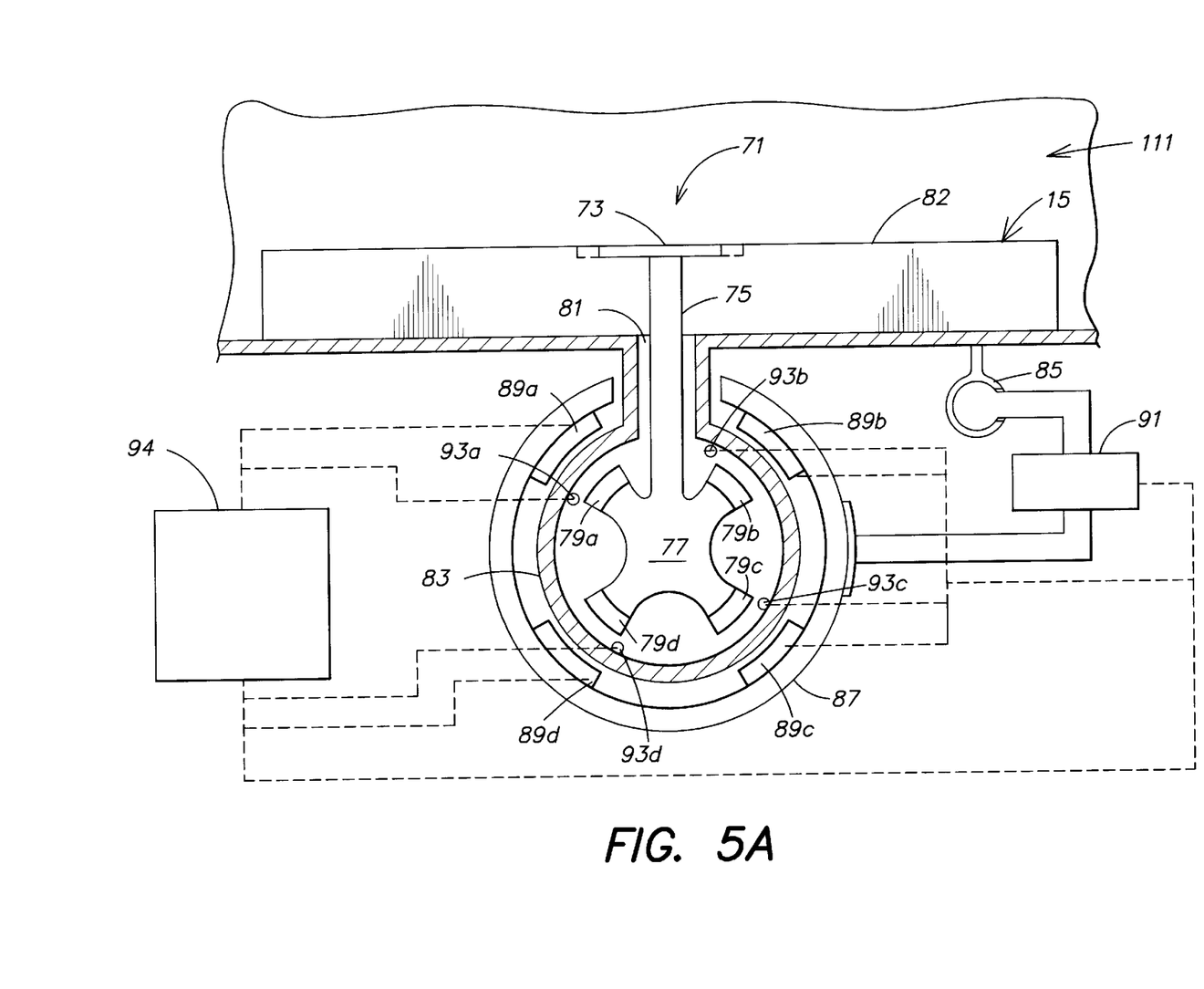
FIG. 5A is a front elevational view of the chamber of FIG. 1, containing a preferred magnetically levitated and magnetically coupled substrate handler.
Figure 5B:
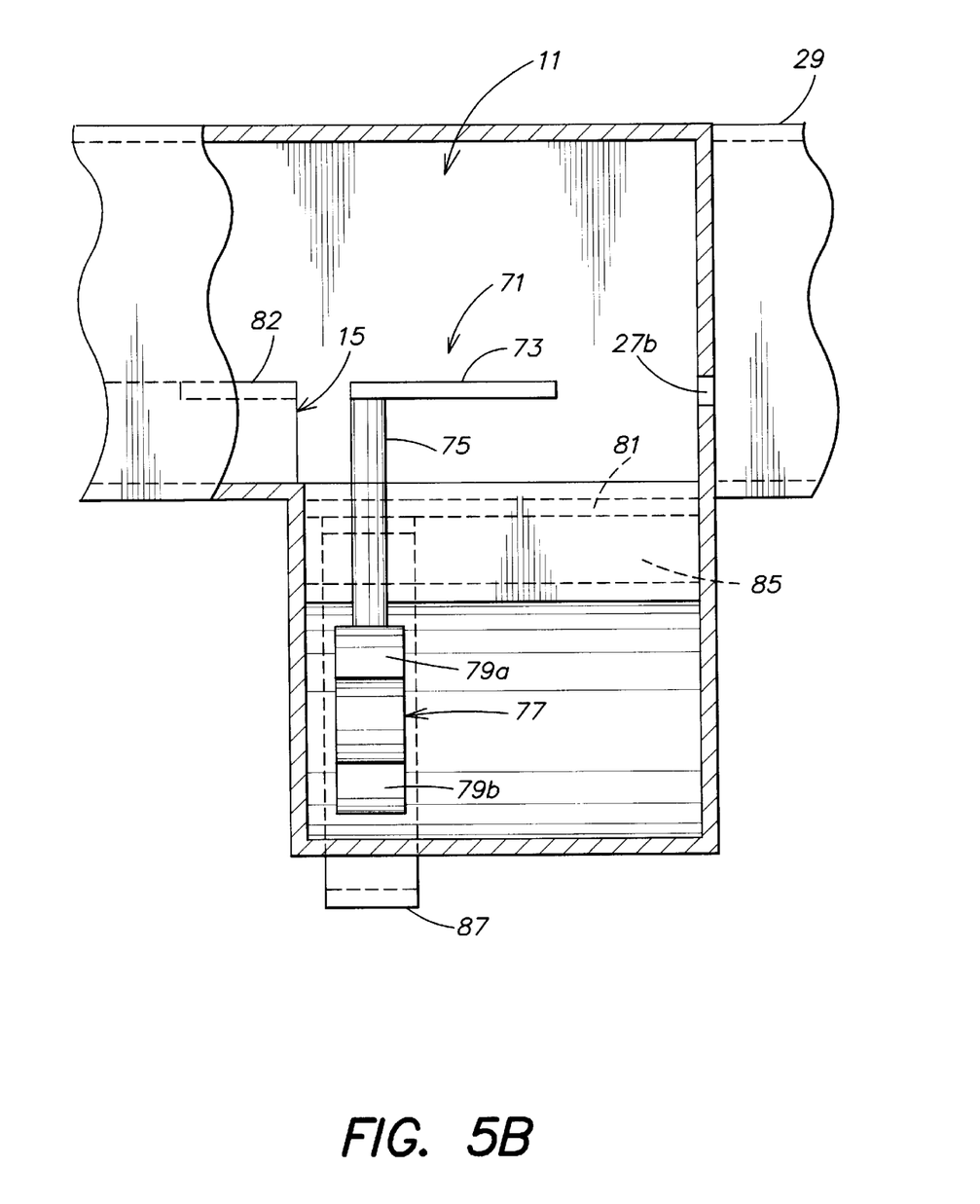
FIG. 5B is a side elevational view of the chamber of FIG. 1, containing the preferred magnetically levitated and magnetically coupled substrate handler of FIG. 5A.

FIGS. 5A and 5B are a front elevational view and a aside elevational view, respectively, of the chamber 11, employing a preferred magnetically levitated and magnetically coupled substrate handler 71, rather than the substrate handler 24 of FIGS. 2A and 2B. The substrate handler 71 comprises a blade 73 mounted on a first end of a shaft 75, and a disk 77 mounted on a second end of the shaft 75. The disk 77 is configured to support four vertically arranged and radially disposed magnets 79a–d (e.g., four magnets approximately equally spaced about the disk 77 as shown). The magnets 79a–d preferably comprise electromagnets. As shown in FIGS. 5A and 5B the shaft 75 extends through an elongated opening 81 located in the bottom wall of the transfer chamber 11. The opening 81 extends from the temperature adjustment plate 15 toward the processing chamber 29 a distance sufficient to place the substrate handler 71 beneath one of the substrate seats 23a–c of the substrate carriage 13 when the substrate handler 71 is in a retracted position, and sufficient to place the blade 73 of the substrate handler 71 above a substrate support (not shown) located within the processing chamber 29. Thus the substrate handler 21 may transport a substrate between the substrate carriage 13 and a processing chamber 29.

An external channel wall 83 is sealed to (or may be integrally formed with) the chamber 11 and is coextensive with the opening 81. The external channel wall 83 is preferably configured to allow magnetic coupling therethrough. The substrate handler 71 is disposed such that the disk 77 is contained within the external channel wall 83, and such that the shaft 75 extends through the elongated opening 81 into the chamber 11 a distance sufficient to place the blade 73 at the same elevation as a top surface 82 of the temperature adjustment plate 15.

A rail 85 extends along the length of the external chamber wall 83. A bracket 87 having four external magnets 89a–d (e.g., magnets) is mounted to the rail 85 and is coupled to a motor 91 such that the motor 91 drives the bracket 87 forward and backward along the rail 85. The external magnets 89a–d are vertically arranged and are radially disposed along the inner surface of the bracket 87 so as to be adjacent the outer surface of the external channel wall 83 and so as to magnetically couple to the internal magnets 79a–d. A distance sensor 93a–d is positioned adjacent each internal/external magnet pair so as to sense the distance therebetween. The sensors 93a–d, the external magnets 89a–d and the motor 91 are each coupled to a controller 94 (or to the controller C of FIG. 1), and the controller is adapted to independently adjust the magnetization level of the external magnets 89a–d (e.g., by adjusting the current supplied to each magnet 89a–d) so as to maintain equal spacing between the magnet pairs, and thus to maintain the robot blade 73 in a level position.

In operation, to transfer a substrate between the substrate carriage 13 and the processing chamber 29, the substrate carriage 13 positions a substrate (not shown) above the blade 73 of the substrate handler 71. The substrate carriage 13 then lowers such that the blade 73 passes through the substrate seat 23 lifting the substrate therefrom. The slit 27b that separates the chamber 11 and the processing chamber 29 also is opened. Thereafter the motor 91 is energized so as to move the bracket 87 along the rail 85 toward the processing chamber 29 at a speed which will maintain magnetic coupling between the internal magnets 79a–d and the external magnets 89a–d. As the bracket 87 moves along the rail 85 the distance sensors 93a–d measure the distance between the internal magnets 79a–d and the external magnets 89a–d. These distance measurements are continually supplied to the controller 94 which is adapted to adjust the magnetization levels of the external magnets 89a–d so as to maintain equal spacing between the various internal and external magnet pairs. The controller 94 also adjusts the speed at which the motor 91 moves the bracket 87 along the rail 85, reducing the speed if the distance sensors 93a–d detect the bracket 87 is moving too quickly to maintain sufficient magnetic coupling between the internal and external magnet pairs. After the substrate handler 71 has traveled a sufficient distance such that the blade 73 is positioned above a substrate support (not shown) located within the processing chamber 29, the motor 91 is de-energized. A substrate lifting mechanism (not shown) such as a plurality of lift pins or a wafer lift hoop elevate from the substrate support, lifting the substrate from the blade 73. The motor 91 is then energized causing the bracket 87 to move backward toward the substrate carriage 13. When the blade 73 has cleared slit 27b, the slit 27b closes and processing begins within the processing chamber 29. The substrate handler 71 remains in position next to the slit 27b until processing within the processing chamber 29 is complete.

After processing within the processing chamber 29 is complete the substrate handler 71 travels forward in the manner described above to extract the substrate from the processing chamber 29. While the substrate handler 71 is within the processing chamber 29, the substrate carriage 13 lowers to a position below the elevation of the substrate handler's blade 73. The substrate handler 71 then retracts carrying the substrate into position above the substrate carriage 13. The substrate carriage 13 elevates lifting the substrate from the substrate handler's blade 73, and simultaneously lifting any substrates positioned on the temperature adjustment plate 15 therefrom. The substrate carriage 13 rotates carrying the substrate retrieved from the processing chamber 29 (the "first" processed substrate) to a position above the temperature adjustment plate 15 and carrying one of the substrates lifted from the temperature adjustment plate 15 into position above the substrate handler 71. The substrate carriage 13 then lowers transferring the substrates from the substrate carriage 13 to the temperature adjustment plate 15 and to the substrate handler 71. A second substrate is then loaded into the processing chamber 29 as described above and, depending on the configuration of the temperature adjustment plate 15, the first processed substrate is either cooled on the temperature adjustment plate 15, heated by the temperature adjustment plate 15 (e.g., as an annealing step) or immediately extracted therefrom by a front-end loader robot (not shown). The front-end loader robot places a new "third" substrate on a first side of the temperature adjustment plate 15 and extracts the first processed substrate from the second side of the temperature adjustment plate 15. It will be understood by those of ordinary skill in the art that the sequence of substrate heating, cooling and processing may vary according to the requirements of the fabrication process being performed. For example, a substrate may be degassed via the temperature adjustment plate 15 prior to entry into the processing chamber 29, and/or cooled, annealed or annealed and cooled by the temperature adjustment plate 15 after processing within the processing chamber 29.

Note that an additional advantage of the inventive substrate handling apparatus described herein is that various components (e.g., the temperature adjustment plate 15, the substrate carriage 13, the substrate handler 24, the magnetically levitated and magnetically coupled substrate handler 71, etc.) are each coupled either directly or indirectly to only one surface of the chamber 11 (e.g., a bottom surface 11b as shown in FIGS. 4A and 4B). Accordingly, as the walls of the chamber 11 deflect during evacuation or venting of the chamber 11 (e.g., due to the generation or elimination of a large pressure differential between the interior and exterior environments of the chamber 11) substrate transfer is unaffected as all substrate handling and/or supporting components are identically affected by such deflections.

Figure 6:
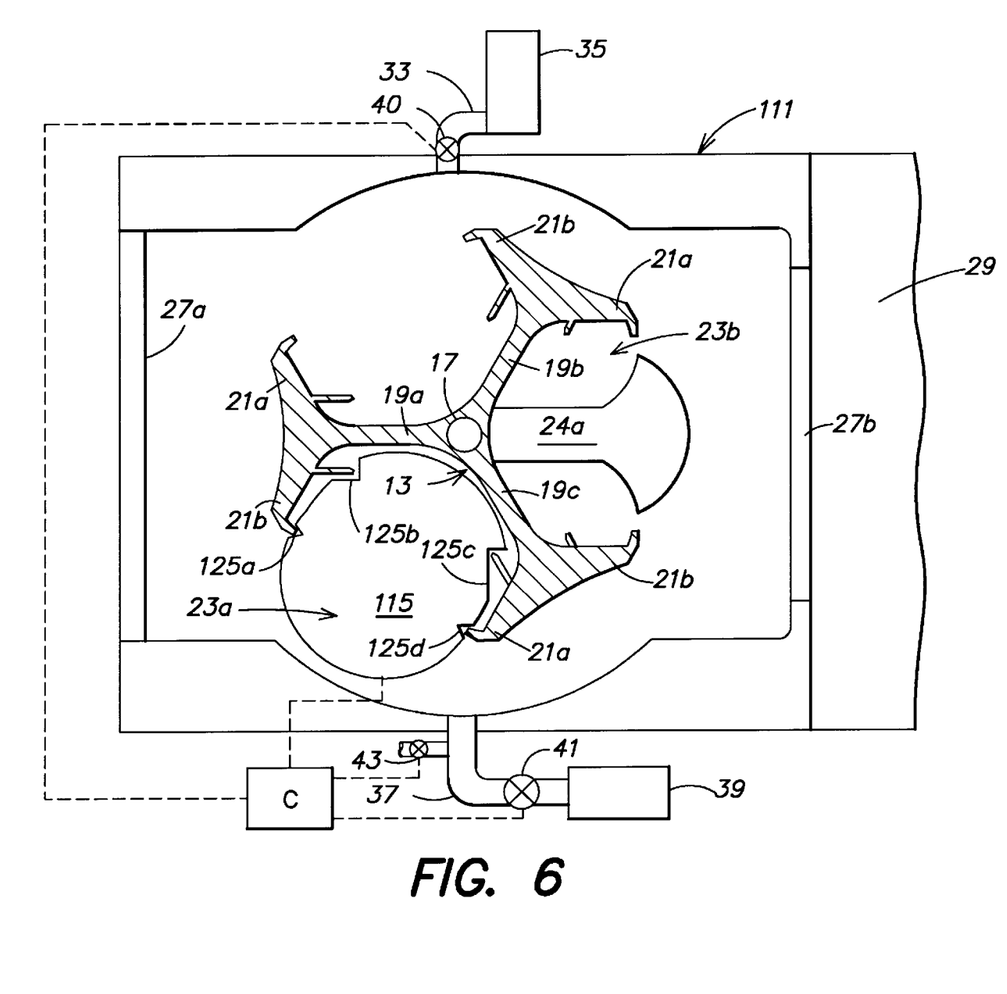
FIG. 6 is a top plan view of a chamber containing a substrate carriage and a temperature adjustment plate on which a substrate may be placed.
Figure 7:
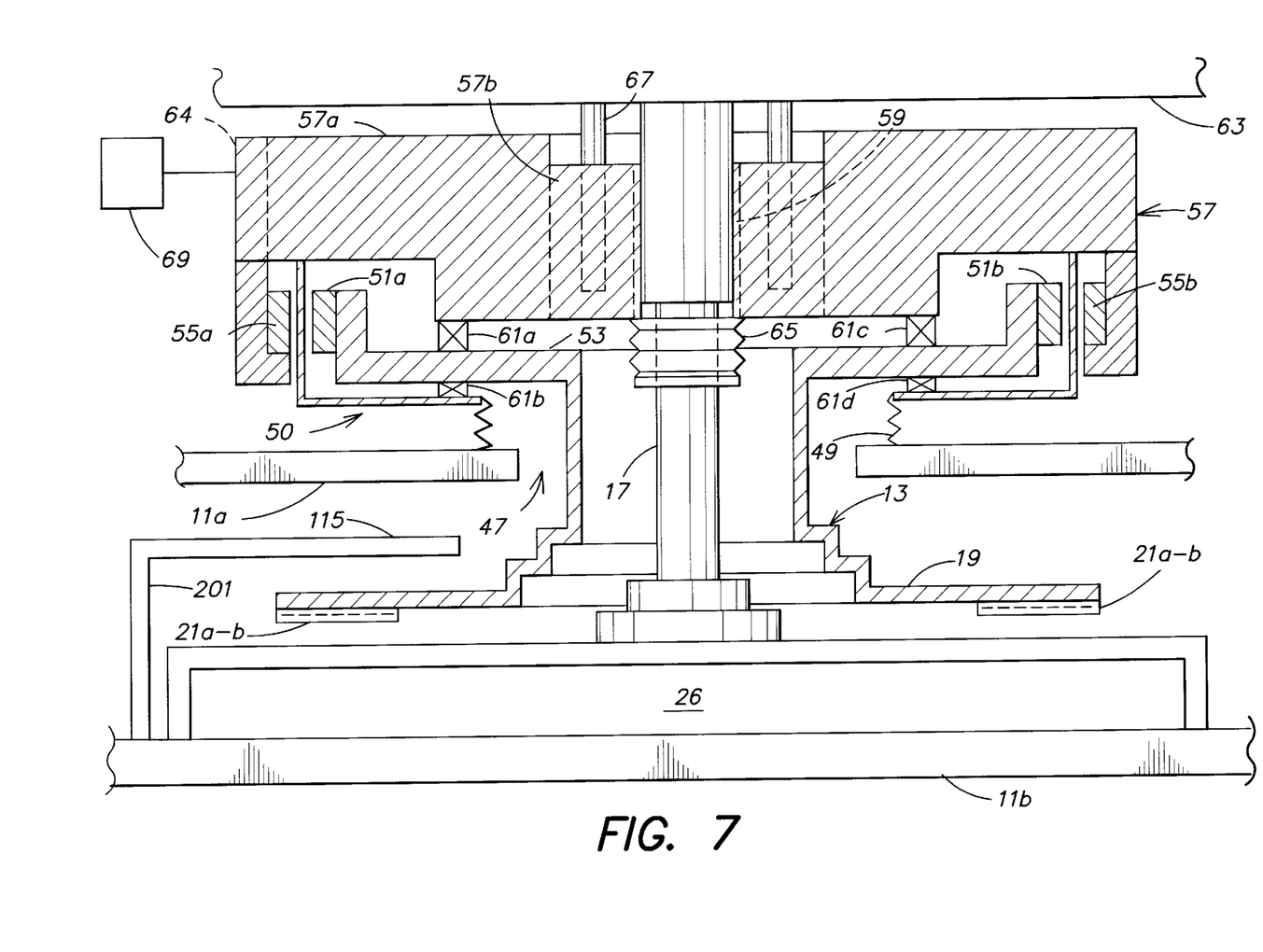
FIG. 7 is a side cross-sectional view of the chamber of FIG. 6, taken along line 7—7 of FIG. 6.

FIG. 6 is a top plan view of a chamber 111 containing a substrate carriage 13 and a temperature adjustment plate 115 coupled to a plurality of processing chambers 29a–c; and FIG. 7 is a side cross-sectional view of the chamber of FIG. 6 taken along line 7—7 of FIG. 6. The components of the chamber 111 are substantially the same as those shown and described with reference to FIGS. 1–5A. Accordingly, only the aspects which differ from FIGS. 1–5A will be described with reference to FIGS. 6 and 7. Specifically, in the chamber 111 of FIGS. 6 and 7, the temperature adjustment plate 115 is located above the substrate carriage 13, but is supported by a lower chamber wall 11b as shown in FIG. 7. In this embodiment no temperature adjustment plate 15 is present below the substrate carriage 13. Thus, the substrate handler 24 may rotate freely, unlike the configuration of FIGS. 1–5A in which the temperature adjustment plate 15 is positioned below the substrate carriage 13. A plurality of chambers (e.g., loadlock L, processing chambers 29a–c) therefore may be coupled to each side of the inventive chamber 111 and substrates may be transferred between the chambers via the substrate handler 24, in contrast to the embodiment of FIG. 1 where the substrate handler 24 can serve only one chamber because the temperature adjustment plate 15 blocks access elsewhere.

The temperature adjustment plate 115 is supported by the bottom surface 11b of the chamber on a support 201, and extends from the support 201 to a position overlying the positions of wafers supported on the substrate carriage 13, and is sized so as to be smaller (e.g., has a smaller diameter) than the passage P between the opposing pairs of branches 19a–c and substrate supports 21a–b which form the substrate seats 23a–c. Notches 125a–b may be formed in the temperature adjustment plate so that a portion of the substrate supports 21a–b may pass therethrough (e.g., the notches 125a–b may mirror the shape of the inwardly extending portions of the substrate support, as shown in FIG. 6).

In operation, the substrates must be moved to be positioned on the top surface of the temperature adjustment plate 115. To do so, the substrate carriage 13 first rotates until an empty substrate seat 23a–c is positioned below the temperature adjustment plate 115. The substrate carriage 13 then elevates to an elevation above that of the temperature adjustment plate 115, the temperature adjustment plate 115 passes through an empty slot of the substrate carriage 13.

After the substrate carriage 13 is above the temperature adjustment plate 115, the substrate carriage 13 rotates to position a substrate above the temperature adjustment plate 115 and then lowers to an elevation below the temperature adjustment plate 115. As the substrate carriage 13 lowers the opposing branches 19a–c and the substrate supports coupled thereto, lower along either side of the temperature adjustment plate 115, such that the substrate seated on the opposing substrate supports is transferred to the temperature adjustment plate 115 and the substrate carriage 13 is again below the temperature adjustment plate 115. The substrate carriage 13 and the substrate handler 23 are then able to transfer other substrates around the chamber 111 and/or among the processing chambers 29a–c and loadlock L. After the temperature adjustment plate 115 has heated or cooled the substrate positioned thereon, the substrate carriage 13 elevates such that an empty substrate seat lifts the substrate from the temperature adjustment plate 115. The substrate carriage 13 rotates to position an empty substrate seat 23a–c above the temperature adjustment plate 115 and then lowers therepast.

The temperature adjustment plate 115 may be configured with heating or cooling components such as those described with reference to FIGS. 3A–C. The temperature adjustment plate 115 may be coupled to any of the chamber 111's sidewalls, or may be coupled via a support 201 that may extend downward from the upper surface 11a of the chamber 11, or that may extend upwardly from the bottom surface 11b of the chamber 111, as shown in FIG. 6. When the temperature adjustment plate 115, the substrate carriage 13 and the substrate handler 24, 71 are each coupled either directly or indirectly to only one surface of the chamber 11 (e.g., the bottom surface 11b as shown in FIG. 6), when the walls of the chamber 11 deflect during evacuation or venting of the chamber 11 (e.g., due to the generation or elimination of a large pressure differential between the interior and exterior environments of the chamber 11) substrate transfer is unaffected as all substrate handling and/or supporting components are identically affected by such deflections.

The foregoing description discloses only the preferred embodiments of the invention, modifications of the above disclosed apparatus and method which fall within the scope of the invention will be readily apparent to those of ordinary skill in the art. For instance, other methods of heating a substrate may be employed, such as employing a heat lamp positioned along the top surface of the chamber 11 to aid in heating of a substrate positioned on the temperature adjustment plate 15 or of a substrate supported by the substrate carriage 13. The specific shape of the various chamber components, the coupling therebetween, the number of substrates to be supported by the temperature adjustment plate 15 and/or the substrate carriage 13 may vary as may the number of processing chambers 29 coupled to the chamber 11. Embodiments having an elevated temperature adjustment plate may have more than one temperature adjustment plate, and each temperature adjustment plate may be placed at a different elevation.

Although a magnetically coupled substrate carriage and a substrate handler which is both magnetically coupled and magnetically levitated are preferred, substrate carriages and substrate handlers which are not magnetically coupled or magnetically levitated may be employed. Finally, although the invention may be advantageously employed with a substrate handler preferably adapted only for transferring a substrate along a straight line (a linear substrate handler), other types of substrate handlers may be employed. In fact, the inventive magnetically coupled and magnetically levitated substrate handler may be employed within a transfer chamber such as that described in parent application Ser. No. 09/332,207 which requires the substrate handler to transport substrates between the substrate carriage and various processing or load lock chambers. The inventive magnetically coupled substrate carriage may be employed in other transfer chamber's such as those described in parent application Ser. No. 09/332,207, as may the temperature adjustment plate. The concept of heating or cooling a substrate via a heating and/or cooling mechanism contained within a transfer chamber, may be employed within other chambers, and is not to be limited to the specific chambers described herein.

An inventive indexing pod door opener may eliminate the need for a separate front end robot. Preferably the pod door opener is provided with vacuum pump/vent capability so that the pod door may operate as a load lock. The substrate carriage chamber's robot may directly extract wafers from the pod door opener. The substrate carriage chamber's robot stroke need not be lengthened because the chamber is designed such that the robot can load/unload wafers from processing chambers, and loading/unloading from one or more processing chambers requires the same stroke as does loading and unloading wafers from the pod door opener. Further, the pod door opener may index vertically to eliminate the need for the pod door receiver to move the pod door vertically to allow access to wafers contained within the pod, and to eliminate the need for the loading/unloading robot to index vertically. Finally, numerous chambers configured in accordance with the invention may be coupled via pass-through tunnels and may allow creation of a staged vacuum system and/or a transfer chamber than is not exposed to atmosphere.

Accordingly, while the present invention has been disclosed in connection with the preferred embodiments thereof, it should be understood that other embodiments may fall within the spirit and scope of the invention, as defined by the following claims.

What is claimed is:

1. A transfer chamber comprising:
    a chamber having:
        a temperature adjustment plate located in an upper portion of the chamber, and having a substrate supporting surface;
        a substrate handler located in a lower portion of the chamber and having a substrate supporting blade; and
        a rotatable substrate carriage adapted so as to raise and lower between an elevation above the substrate supporting surface of the temperature adjustment plate, and an elevation below the substrate supporting blade of the substrate handler.

2. The apparatus of claim 1 wherein the temperature adjustment plate is adapted to cool a substrate placed thereon.

3. The apparatus of claim 1 wherein the temperature adjustment plate is adapted to heat a substrate placed thereon.

4. The apparatus of claim 1 wherein the rotatable substrate carriage comprises a plurality of substrate seats, each substrate seat comprising:
    a pair of opposing substrate supports that define a passage through which both the substrate handler blade, and the temperature adjustment plate may pass.

5. The apparatus of claim 4 wherein the temperature adjustment plate has a plurality of notches formed therein through which the substrate supports may pass.

6. The apparatus of claim 1 wherein the temperature adjustment plate, the substrate handler and the rotatable substrate carriage are each coupled to a common surface of the chamber.

7. The apparatus of claim 6 wherein the common surface of the chamber is a bottom surface of the chamber.

8. A processing system comprising:
    the transfer chamber of claim 1; and
    at least one processing chamber coupled to the transfer chamber such that the substrate handler may transfer substrates therebetween.

9. The processing system of claim 8 further comprising:
    a loadlock coupled to the transfer chamber.

* * * * *